(12) United States Patent
Ma et al.

(10) Patent No.: US 8,836,140 B2
(45) Date of Patent: Sep. 16, 2014

(54) THREE-DIMENSIONAL VERTICALLY INTERCONNECTED STRUCTURE

(75) Inventors: Shenglin Ma, Beijing (CN); Min Miao, Beijing (CN); Yunhui Zhu, Beijing (CN); Xin Sun, Beijing (CN); Yufeng Jin, Beijing (CN)

(73) Assignee: Peking University, Beijing (CN)

( * ) Notice: Subject to any disclaimer, the term of this patent is extended or adjusted under 35 U.S.C. 154(b) by 0 days.

(21) Appl. No.: 13/806,136

(22) PCT Filed: Aug. 5, 2011

(86) PCT No.: PCT/CN2011/001288
§ 371 (c)(1),
(2), (4) Date: Dec. 21, 2012

(87) PCT Pub. No.: WO2012/048516
PCT Pub. Date: Apr. 19, 2012

(65) Prior Publication Data
US 2013/0093091 A1    Apr. 18, 2013

(30) Foreign Application Priority Data

Oct. 12, 2010  (CN) .......................... 2010 1 0513047

(51) Int. Cl.
H01L 23/48    (2006.01)
H01L 25/065   (2006.01)
H01L 21/768   (2006.01)
H01L 23/522   (2006.01)
H01L 21/50    (2006.01)
H01L 25/00    (2006.01)
H01L 23/00    (2006.01)

(52) U.S. Cl.
CPC ... H01L 23/5226 (2013.01); *H01L 2924/01029* (2013.01); *H01L 2224/2919* (2013.01); *H01L 24/32* (2013.01); *H01L 2225/06558* (2013.01); *H01L 24/05* (2013.01); H01L 23/481 (2013.01); *H01L 2224/9202* (2013.01); *H01L 2224/0557* (2013.01); *H01L 2224/291* (2013.01); H01L 25/0657 (2013.01); *H01L 2225/06541* (2013.01); *H01L 24/83* (2013.01); *H01L 2224/32145* (2013.01); *H01L 24/94* (2013.01); H01L 21/76898 (2013.01); *H01L 2224/94* (2013.01); *H01L 2224/83896* (2013.01); *H01L 2225/06565* (2013.01); *H01L 2225/06589* (2013.01); H01L 21/50 (2013.01); H01L 24/92 (2013.01); H01L 25/50 (2013.01); *H01L 2225/06544* (2013.01); *H01L 2924/01079* (2013.01); *H01L 24/29* (2013.01)
USPC ... 257/774; 257/71; 257/E23.145; 257/E23.169

(58) Field of Classification Search
CPC ............ H01L 2224/00; H01L 2924/00; H01L 23/481
USPC .................. 257/774, 751, E23.145, E23.169
See application file for complete search history.

(56) References Cited

U.S. PATENT DOCUMENTS

2009/0134500 A1    5/2009  Kuo
2010/0072606 A1*   3/2010  Yang ............................ 257/692

FOREIGN PATENT DOCUMENTS

CN      101542701       9/2009
KR      10-20080012462  2/2008

*Primary Examiner* — Andy Huynh
(74) *Attorney, Agent, or Firm* — Eagle IP Limited; Jacqueline C. Lui

(57) ABSTRACT

The present invention discloses a three-dimensional vertically interconnected structure and a fabricating method for the same. The structure comprises at least two layers of chips which are stacked in sequence or stacked together face to face, and an adhesive material is used for adhesion between adjacent layers of said chips, each layer of chips contains a substrate layer and a dielectric layer sequentially bottom to top; an front surface of the chip has a first concave with an annular cross section, and the first concave is filled with metal inside to form a first electrical conductive ring connecting to microelectronic devices inside the chip via a redistribution layer; a first through layers of chips hole having the same radius and center as inner ring of the first electrical conductive ring penetrates the stacked chips and has a first micro electrical conductive pole inside that is electrically connected to the first electrical conductive ring. The three-dimensional vertically interconnected structure of the present invention enhances the strength of the electric interconnection and the adhesion between adjacent layers of chips, and in the meantime the disclosed fabricating method simplifies the process difficulty and therefore improves the yield.

8 Claims, 6 Drawing Sheets

THREE-DIMENSIONAL VERTICALLY INTERCONNECTED STRUCTURE

FIELD OF THE INVENTION

The present invention relates to fields of semiconductors and micro-sensor manufacture, and more particularly, to a three-dimensional vertically interconnected structure and a fabricating method thereof.

BACKGROUND OF THE INVENTION

A Through-Silicon-Via (TSV) enabled 3D integration technology can provide a high packaging density which enables more microelectronic devices to be contained per unit volume, a shorter signal path to reduce parasitic capacitances, an increased operation frequency for the chips, etc. and thus attracts many attentions from academic and industrial circles. However, the three-dimensionally stacked chips with TSV interconnection still face challenges from several aspects such as TSV fabrication, TSV insulation, TSV filling with copper electroplating, temporary bonding of ultra-thin wafers, etc., of which those from aspects such as micro-solder balls or bonding pad fabricating as well as low temperature bonding thereof, thermal managing for stacked chips, and signal managing between vertically adjacent chips inside the stacks are particularly notable. The electrical interconnection and physical connection between the vertically adjacent chips in the stacks require a bonding that is based on micro-solder balls or bonding pads for carrying out. On one hand, the TSV enabled 3D integration technology requires downscaling of micro-solder balls or bonding pads to maintain its technological advantages, with a typical size of the micro-solder balls or bonding pads scaling down from hundreds micrometers to tens micrometers even to several micrometers. On the other hand, the TSV enabled 3D integration technology depends on micro-solder balls or bonding pads to achieve a reliable electrical interconnection and a physical connection, while scaling down of the micro-ball or bonding pads is less favorable for reliable electrical and physical connection. In addition, the increase in the number of stacked layers requires at least one or more times of bonding and reflow processes to implement the bonding between vertically adjacent chips of the stacks. In this case, the micro-solder balls or bonding pads having completed one time of bonding need to go through another bonding and another reflow processes to implement a multi-layered stack, which would cause damages to the micro-solder balls or bonding pads having already been bonded, and influence the reliability.

Moreover, the power dissipation per unit volume has a rise with an increase of the number of the stacked layers. When the heat released from the chips inside the stacks increases, it is liable to generate hotspots inside the stacks, which results in a performance degradation of the stacked chips. This brings severe threat to the reliability of the stacks.

The TSV enabled 3D integration technology desires thickness of each layer of the chips in the stack keep declining, which shortens a signal path between vertically adjacent chips inside the stacks, and enhances the performance of the stacked chips as well as the package density. However, when the thickness of the chips located in the stacks decreases, the signals transmission across the surfaces of the vertically adjacent chips in the stacks may be interfered with each other, which is not favorable for the chip stacks to function normally.

SUMMARY OF THE INVENTION

1. Technical Problem to be Solved

The technical problem to be solved by the present invention is how to enhance the strength of the electric interconnection and the bonding strength between adjacent layers of chips in the three-dimensional interconnected stack in the fabricating of microelectronic devices, in order to increase yield.

2. Technical Solution

In order to solve the above-mentioned problems, a three-dimensional vertically interconnected structure is proposed, it comprises at least two layers of chips which are stacked face to back or face to face (face indicates the side with active devices on the chip, and back indicates the opposite side. For convenience of description, the surface of chip or wafer with active devices is also named as the front surface of the chip or wafer, the opposite surface is named as the backside surface.), and between the adjacent layers of chips there's a layer of adhesive material used for implementing an adhesion; each layer of chips in the vertically interconnected structure has a device layer on the substrate and a dielectric layer, sequentially from bottom to top, and a first concave with an annular cross section that embedded into the chip from the dielectric layer to the device layer or deeper into the substrate, and the first concave is filled with metal inside to form a first electrical conductive ring which is connected to microelectronic devices inside the layer of chip via a redistribution layer atop the dielectric layer; a first through layers of chips hole located at the inner of the first conductive ring on each layer and having the same radius and center as the inner ring of the first conductive ring penetrates the layers of chips in the three dimensional vertically interconnected structure and has a first micro electrical conductive pole inside.

Preferably, on the front side and/or the back side of each layer of chip(s), there are/is a first thermal conductive ring and a thermal conductive layer, the thermal conductive ring with an annular cross-section is embedded into each layer of chip and connected with the thermal conductive layer; a second through layers of chips hole located at the inner area of the first thermal conductive ring on each layer and having the same radius and center as the inner ring of the first thermal conductive ring penetrates the stacked layers of chips in the three dimensional vertically interconnected structure and has a first thermal conductive pole inside.

Preferably, on the front side and/or the back side of each layer of chip there's a second concave with an annular cross section, and the second concave is filled with metal inside to form a second electrical conductive ring; the front side and/or the back side are/is coated with a patterned grounding conductive layer, and the second electrical conductive ring is connected with the grounding conductive layer; a third through layers of chips hole located at the inner area of the second concave and having the same radius and center as the inner ring of the second electrical conductive ring penetrates the stacked layers of chips in the three dimensional vertically interconnected structure and has a second micro electrical conductive pole inside.

Preferably, the adhesive material between adjacent layers of chips in three dimensional vertically interconnected structure has micro-fluid channels inside, and the micro-fluid channel contains a fourth through hole vertically penetrating the whole layers of chips.

Preferably, the adhesive material is organics or metallic solders, wherein the organic adhesive material includes polyimide, epoxy resin, ultraviolet ray adhesive tape, dibenzo cyclobutene, non-conductive adhesive, silicon rubber or p-Xylene, and the metallic solders include copper, tungsten, gold, silver, tin, indium, nickel, palladium, copper-tin alloy, tin-silver-copper alloy, tin-silver alloy, gold-tin alloy, indium-gold alloy, lead-tin alloy, nickel-palladium alloy, nickel-gold alloy or nickel-palladium-gold alloy.

Preferably, the depth of the first concave is in a range from 1 μm to 30 μm.

Preferably, the thermal conductive layer is of metallic thermal conductive material including gold, copper or aluminum.

Preferably, the grounding conductive layer is of metallic material or conductive paste, wherein the metallic material is gold, copper or aluminum.

Preferably, the first through layers of chips hole, the second through layers of chips hole and/or the third through layers of chips hole have/has a shape of cylinder, prism, cone or pyramid.

The present invention further provides a method for fabricating a three-dimensional vertically interconnected structure, which comprises the steps as follows:

S1, conducting a lithography on the surface of a single layer of silicon wafer or chip which has or has not undergone a thinning process to form mask for the first concave, then sequentially etching the dielectric layer, device layer and a substrate layer of the single layer of wafer or chip to form a first concave of fergitun-shape;

S2, depositing a barrier layer and a seed layer to cover an inside wall of the first concave, and then conducting copper electroplating to fill the first concave, for forming a first electrical conductive ring;

S3, forming a redistribution layer which connects the first electrical conductive ring with microelectronic devices inside the layer of wafer or chip, wherein the redistribution layer comprises a dielectric layer and a metallic interconnection layer;

S4, etching the dielectric layer of the redistribution layer, the dielectric layer, device layer and substrate of the wafer or chip sequentially to form a first through hole inside the first electrical conductive ring, wherein the first through hole has the same cross section shape as/the identical center to that of the inner ring of the first electrical conductive ring;

S5, aligning the layers of wafers or chips which have completed steps S1-S4 and stacking them with adhesive bonding sequentially; the first through holes of each layers is aligned and forms a through layers of chips hole;

S6, depositing a seed layer and electroplating on one side of the multiple stacked layers of wafers or chips to seal the through layers of chips hole; and the electroplated metallic layer functions as a seed layer for following electroplating; filling the through layers of chips holes which penetrate the multi-layered stack from bottom to top with electroplating to form a first micro electrical conductive pole, and removing the seed layer and electroplated metallic layer, for finishing the fabricating of a three-dimensional vertically interconnected structure.

Preferably, in step S2, depositing an insulation layer to cover the inside wall of the first concave, before depositing the barrier layer and the seed layer, wherein the insulation layer is selected as Sillica or polyimide, and a method of sputtering or plasma enhanced chemical vapor deposition is used for depositing the insulation layer.

Preferably, after step S2, repeating steps S1-S2 to form a second electrical conductive electrical ring and/or a thermal conductive ring having the similar shape as the first electrical conductive ring on the front surface and/or the backside surface of the single layer of wafer or chip.

Preferably, in step S3, forming a grounding electrical conductive layer and/or a thermal conductive layer on the front surface and/or the backside surface of the single layer of wafer or chip, wherein the grounding electrical conductive layer is connected with the second electrical conductive ring, and the thermal conductive layer is connected with the thermal conductive ring.

Preferably, in step S5, patterning the layer of adhesive material to form micro-fluid channels for heat dissipation.

The present invention further provides a method for fabricating a three-dimensional vertically interconnected structure, which comprises the steps as follows:

S1, conducting a lithography on the front surface of a single layer of silicon wafer or chip to form mask for the first concave, then sequentially etching a dielectric layer, the device layer and the substrate of the single layer of wafer or chip to form a first concave of fergitun-shape;

S2, depositing a barrier layer and a seed layer to cover an inside wall of the first concave, and conducting copper electroplating to fill the first concave, for forming a first electrical conductive ring;

S3, forming a redistribution layer which connects the first electrical conductive ring with microelectronic devices inside the layer of wafer or chip, wherein the redistribution layer comprises a dielectric layer and a metallic interconnection layer;

S4, sequentially etching the dielectric layer of the redistribution layer, the dielectric layer and the substrate of the layer of wafer or chip to form a blind hole inside the first electrical conductive ring, which has the same radius and center as the inner ring of the first electrical conductive ring;

S5, stacking two layers of wafers or chips which have completed steps S1-S4 face-to-face and aligning the same, wherein the wafers or chips are adhered to each other by using organics or metallic solders;

S6, conducting a thinning process on both sides of the stacked layers of wafers or chips until the blind hole is exposed to implement a through hole;

S7, stacking the layers of wafers or chips which have completed steps S1-S4 on the stacked layers of wafers or chips which have completed steps S1-S6, or stacking the stacked layers of wafers or chips which have completed steps S1-S6 and aligning the same, wherein the stacked layers of wafers or chips and the layers of wafer are adhered together with organics or metallic solders; and then repeating step S6 to implement a stacking of three or more layers of wafers or chips with a through layers of chips hole;

S8, depositing a seed layer and conducting electroplating on one side of multi-layered, stacked wafers or chips to seal the through hole; and the electroplated layer functions as seed layer for following electroplating; filling the through layers of wafers or chips holes which penetrate the multi-layered, stacked wafers or chips from bottom to top with electroplating to form a micro electrical conductive pole, and removing the seed layer and electroplated metallic layer, for finishing a fabrication of a three-dimensional vertically interconnected structure.

Preferably, in step S3, forming a second electrical conductive ring and/or a thermal conductive ring on the front surface and/or the backside surface of the single layer of wafer or chip.

Preferably, in step S3, forming a grounding electrical conductive layer and/or a thermal conductive layer on the front surface and/or the backside surface of the single layer of wafer or chip, wherein the grounding electrical conductive layer is connected with the second electrical conductive ring, and the thermal conductive layer is connected with the thermal conductive ring.

Preferably, in step S5, patterning the adhesive material to form micro-fluid channels for heat dissipation.

Preferably, after step S4, depositing an insulation layer to cover a sidewall and a bottom of the blind hole, and conducting etching at an opening of the blind hole to remove the insulation layer inside the electrical conductive ring and expose the inside wall of the first electrical conductive ring.

3. Beneficial Effects

Compared with traditional TSV-based three-dimensional integration technologies, the present invention has implemented an adhesion between adjacent layers of wafers or chips and an electric interconnection between different layer of wafers or chips via different structures. Organic materials and solders are applied to implement the adhesion between adjacent layers of wafers or chips only, but not the electric interconnection between different layers of wafers or chips; therefore flexible bonding, welding and adhesive bonding technologies for wafers may be used. The electrical conductive ring that surrounds a micro electrical conductive pole internally penetrating the stacked wafers or chips implements an electric interconnection between wafers and an electric interconnection between microelectronic devices inside the wafers or chips, with simple process and high reliability. The designs of micro-fluid channels and thermal conductive layers between vertically adjacent wafers or chips in the stacks can effectively relieve a heat accumulation of chips in the stacks. The design of grounding metallic layers between vertically adjacent wafers or chips in the stacks can effectively relieve a signal crosstalk between chips in the stacks. After finishing an adhesion between adjacent layers of wafers or chips, a micro electrical conductive pole which internally penetrates through layers of wafers or chips hole of the stack is formed in a single process step, which implements an electric interconnection between different layers of wafers or chips of a three-dimensional vertically interconnected structure. Therefore, the difficulty in the filling process is reduced, the processing time is shortened and the rate of finished, electroplated products is increased.

DETAILED DESCRIPTION OF THE PREFERRED EMBODIMENTS

Figure 1A:
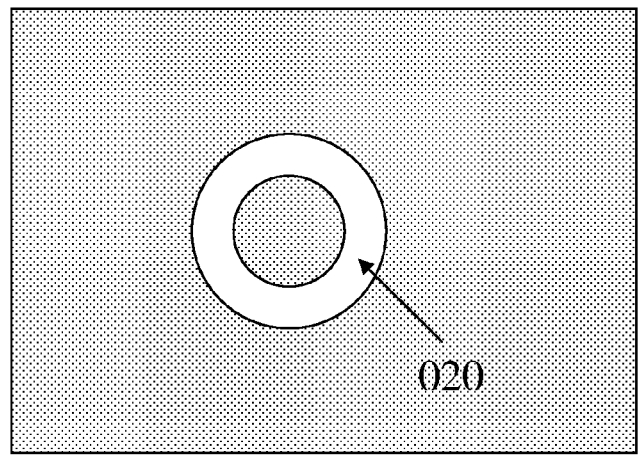
FIG. 1(a)-(b) are a top view and a cross-sectional schematic view respectively illustrating that a fergitun-shaped concave is formed on the front surface of a single layer of wafer or chip in a three-dimensional vertical interconnection method according to an embodiment of the present invention.

The embodiments of the present invention are further described below in conjunction with drawings and examples. The following embodiments are intended to describe the present invention, but not to limit the scope of the present invention.

The First Embodiment

With reference to FIG. 1-FIG. 7, the first embodiment of the present invention provides a three-dimensional vertically interconnected structure, it comprises at least two layers of wafers or chips which are stacked in sequence or stacked together face-to-face and a layer of adhesive material 040 is used for adhesion between different layers of wafers or chips; each layer of wafers or chips contains a substrate layer 010 and a dielectric layer 011 sequentially from bottom to top; an upper surface of the wafer or chip has a fergitun-shaped concave 020 whose cross-section is of annular shape, and the concave 020 is filled with metal inside to form an electrical conductive ring 022 which connects to microelectronic devices inside the wafer or chip via a redistribution layer 012; a TSV 030, having the same inner diameter and the identical center with that of the electrical conductive ring 022, penetrates the stacked wafers or chips and is provided with a micro electrical conductive pole inside.

Preferably, the layer of adhesive material 040 between adjacent layers of wafers or chips has micro-fluid channels inside, and the micro-fluid channel contains through holes vertically penetrating said stacked wafers or chips.

The Second Embodiment

The second embodiment of the present invention provides a three-dimensional vertically interconnected structure, it comprises at least two layers of wafers or chips which are stacked in sequence or stacked together face-to-face, and a layer of adhesive material 040 is used for an adhesion between adjacent layers of wafers or chips; each layer of wafers or chips contains a substrate layer 010 and a surface dielectric layer 011 sequentially from bottom to top; an upper surface of the wafer or chip has a fergitun-shaped concave 020 whose cross-section is of annular shape, and the concave 020 is filled with metal inside to form an electrical conductive ring 022 which connects to microelectronic devices inside the wafer or chip via a redistribution layer 012; a through layers of wafer or chip hole 030, having the same inner diameter and the identical center with that of the electrical conductive ring 022, penetrates the stacked wafers or chips and is provided with a micro electrical conductive pole inside.

A front surface and/or a backside surface of each layer of wafers or chips have/has a thermal conductive ring, a front surface and/or a backside surface of the wafer or chip have/has a thermal conductive layer, and the thermal conductive layer is connected with the thermal conductive ring; a through layers of wafer or chip hole, having the same inner diameter and the identical center with that of the thermal conductive ring, penetrates the stacked wafers or chips and is provided with a micro thermal conductive pole inside.

Preferably, the layer of adhesive material 040 between adjacent layers of wafers or chips has micro-fluid channels inside which contain through layers of wafer or chips holes, and said through layers of wafer or chips holes vertically penetrate said stacked wafers or chips.

The Third Embodiment

The third embodiment of the present invention provides a three-dimensional vertically interconnected structure, it comprises at least two layers of wafers or chips which are stacked in sequence or stacked together face-to-face, and a layer of adhesive material 040 is used for adhesion between adjacent layers of wafers or chips; each layer of wafers or chips contains a substrate layer 010 and a dielectric layer 011 sequentially from bottom to top; a front surface of the wafer or chip has a fergitun-shaped concave 020 whose cross-section is of annular shape, and the concave 020 is filled with metal inside to form an electrical conductive ring 022 which connects to microelectronic devices inside the wafer or chip via a redistribution layer 012; a through layers of wafers or chips hole 030, having the same inner diameter and the identical center with that of the electrical conductive ring 022, penetrates the stacked wafers or chips and is provided with a micro electrical conductive pole inside.

A front surface and/or a backside surface of the wafer or chip have/has a concave 020 whose cross-section is of annular shape, and the concave 020 is filled with metal to form a conductive ring 022; the backside surface (of the wafer or chip) is coated with a grounding conductive layer, and the conductive ring is connected with the grounding conductive layer; a through layers of wafers or chips hole 030, having the same inner diameter and the identical center with that of the conductive ring, penetrates said stacked wafers or chips and is provided with a micro electrical conductive pole 033 inside.

Preferably, the layer of adhesive material 040 between different layers of wafers or chips has micro-fluid channels inside, and the micro-fluid channel contains through holes vertically penetrating said stacked wafers or chips.

The Fourth Embodiment

The fourth embodiment of the present invention provides a three-dimensional vertically interconnected structure, it comprises at least two layers of wafers or chips which are stacked together back to face or face-to-face, and a layer of adhesive material 040 is used for an adhesion between adjacent layers of wafers or chips; each layer of wafers or chips contains a substrate layer populated with electric devices and a dielectric layer 011, sequentially from bottom to top; the front surface of the wafer or chip has a fergitun-shaped concave 020 whose cross-section is of annular shape, and the concave 020 is filled with metal inside to form an electrical conductive ring 022 which connects to microelectronic devices inside the wafer or chip via a redistribution layer 012; a through layers of wafers or chips hole 030, having the same inner diameter and the identical center with that of the electrical conductive ring 022, penetrates the stacked wafers or chips and is provided with a micro electrical conductive pole inside.

A front surface and/or a backside surface of each layer of wafers or chips have/has a thermal conductive ring, an front surface and/or a backside surface of the wafer or chip have/has a thermal conductive layer, and the thermal conductive layer is connected with the thermal conductive ring; a through layers of wafers or chips hole, having the same inner diameter and the identical center with that of the thermal conductive ring, penetrates the stacked wafers or chips and is provided with a micro thermal conductive pole inside.

A front surface and/or a backside surface of the wafer or chip have/has a concave 020 whose cross-section is of annular shape, and the concave 020 is filled with metal inside to form an electrical conductive ring 022; the backside surface (of the wafer or chip) is coated with a grounding electrical conductive layer, and the electrical conductive ring is connected with the grounding electrical conductive layer; a through layers of wafers or chips hole 030, having the same inner diameter and the identical center with that of the electrical conductive ring, penetrates said stacked wafers or chips and is provided with a micro electrical conductive pole 033 inside.

The layer of adhesive material 040 between adjacent layers of wafers or chips has micro-fluid channels inside, and the micro-fluid channel contains through layers of wafers or chips holes vertically penetrating said stacked wafers or chips.

The adhesive material in each of the above-mentioned examples may be selected as organics or metallic solders; wherein, the organics includes polyimide, epoxy resin, ultraviolet ray adhesive tape, dibenzo cyclobutene, non-conductive adhesive, silicon rubber or 2 p-Xylene, and the metallic solders include copper, tungsten, gold, silver, tin, indium, nickel, palladium, copper-tin alloy, tin-silver-copper alloy, tin-silver alloy, gold-tin alloy, indium-gold alloy, lead-tin alloy, nickel-palladium alloy, nickel-gold alloy or nickel-palladium-gold alloy.

The fabricating method for the above-mentioned three-dimensional vertically interconnected structure may be implemented by two examples as follows.

For convenience of descriptions, the front surface of the wafer which has completed fabrication of microelectronic devices indicates the surface of the wafer populated with dielectric layer and devices and the backside surface indicates a surface opposite to the front surface.

The Fifth Embodiment

Figure 1B:
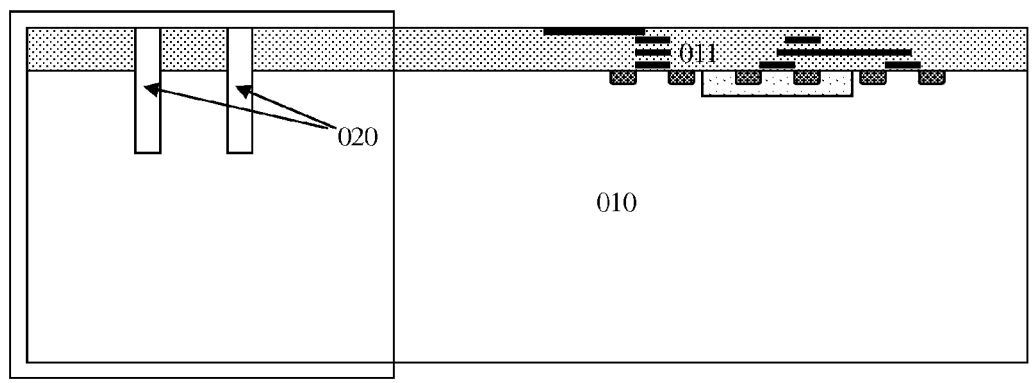

A fabricating method for a three-dimensional vertically interconnected structure comprises the following steps:

Step A. conducting lithography on the front surface of a single layer of silicon wafer or chip which has completed the fabrication of microelectronic devices therein to form annular patterns, and then sequentially etching a dielectric layer 011 and a substrate layer 010 of the single layer of wafer or chip to form a fergitun-shaped concave 020. FIG. 1(a) and FIG. 1(b) are respectively a top view and a cross-sectional view along the radial direction of the fergitun-shaped concave 020. Etching of the dielectric layer 011 of the single layer of wafer may be implemented with reactive ion etching (RIE) or other wet etching or dry etching techniques. The etching of the substrate layer 010 of the wafer or chip may be implemented by applying deep reactive etching (DRIE) or other wet etching or dry etching techniques. The depth of the concave 020 is preferably in a range from 1 µm to 30 µm. The single layer of wafer or chip may be an ultra-thin one which has been conducted a thinning process on the backside thereof.

Figure 2:
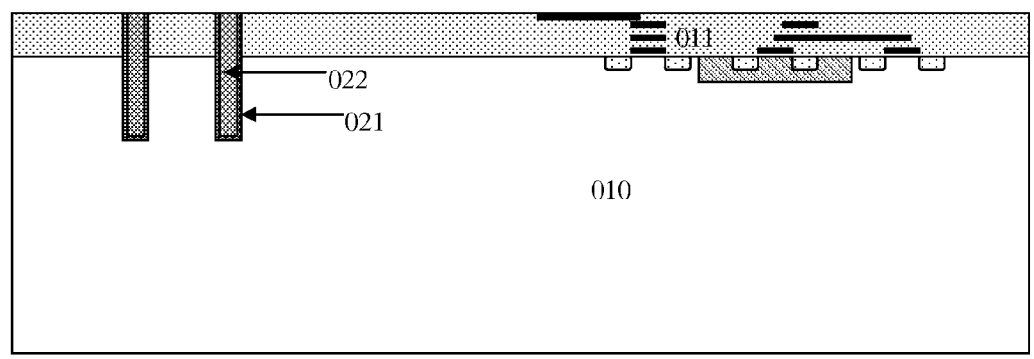
FIG. 2 is a cross-sectional schematic view illustrating that an electrical conductive ring is formed in the front surface of a single layer of wafer or chip in a three-dimensional vertical interconnection method according to an embodiment of the present invention.

Step B. depositing a barrier layer of TiW, and a seed layer of gold (Au) or copper (Cu) to cover the inside wall of the fergitun-shaped concave 020; conducting lithography to form a photo-resists mask on the front surface of the wafer which exposes the concave region and an electrode contacting area and covers the remaining areas of the wafers; conducting copper electroplating to fill the fergitun-shaped concave 020. The metal for filling the fergitun-shaped concave 020 forms a fergitun-shaped electrical conductive ring 022, as shown in FIG. 2. The photo-resist, the barrier layer and the seed layer outside the fergitun-shaped concave 020 are then removed, and the front surface can be planarized depending on requirements. An insulation layer 021 (such as sillica, polyimide, etc.) can be deposited to cover an inside wall of the concave 020, before depositing the barrier layer and the seed layer. The deposition of the barrier layer and the seed layer can be implemented by applying conventional processes in semiconductor industry, such as sputtering, evaporation, chemical vapor deposition (CVD), etc. The deposition of material for the insulation layer can be implemented by applying conventional processes in semiconductor industry such as sputtering and plasma enhanced chemical vapor deposition (PECVD), etc.

Similarly, step A and step B can be repeated to form a fergitun-shaped concave 020, a insulation layer 021 and an electrical conductive ring 022 having the similar structures (with those have been described) on the backside of a single layer of wafer or chip.

Step C. forming a redistribution layer 012 which connects the electrical conductive ring with microelectronic devices inside the wafer or chip, wherein an interconnecting wire 013 of the redistribution layer 012 can be of metal such as copper, aluminum, etc., and can be also of other metal. And the dielectric layer of the redistribution layer 012 may be of a material such as polyimide, BCB, epoxy resin, etc., and may be also of other dielectric materials. This step includes but not limited to formation of at least one redistribution layer 012.

This step may further include forming a grounding electrical conductive layer or a thermal conductive layer on the front surface or a backside surface of a single layer of wafer or chip. The grounding electrical conductive layer is connected with an electrical conductive ring, and the thermal conductive layer is connected with a thermal conductive ring.

The grounding electrical conductive layer may be of a material such as gold, copper, aluminum, etc., and may be also of other conductive pastes.

The thermal conductive layer may be of a thermal conductive material such as gold, copper, aluminum, etc., and may be also of other heat dissipation materials.

Step D. conducting lithography, and sequentially etching the dielectric layer of the redistribution layer 012 and the dielectric layer 011 to form a Through-Silicon-Via 030 inside the electrical conductive ring 022; The TSV 030 has the same radius and the center as the inner ring of the electric conductive ring. The forming of the TSV 030 may be implemented by applying depth reactive ion etching (DRIE) technique or other technique such as laser drilling, etc. Under condition of DRIE, TSV 030 may be implemented by etching from one side or etching from one side then the other. The etching for the dielectric layer 011 and the dielectric layer of the redistribution layer 012 may be implemented by applying RIE or other wet or dry etching techniques. If the depth of a single layer of wafer or chip exceeds a value of 300 µm, it's preferable to apply the double-sided etching, in order to increase the efficiency. An insulation layer 031 of conventional materials for insulation layers in semiconductor industry such as sillica may be deposited to cover the sidewall and the bottom of the TSV 030. Conducting etching at an opening of the TSV 030 of the wafer or chip to remove the insulation layer 031 inside the electrical conductive ring 022 and expose the sidewall of the electrical conductive ring 022.

Figure 5:
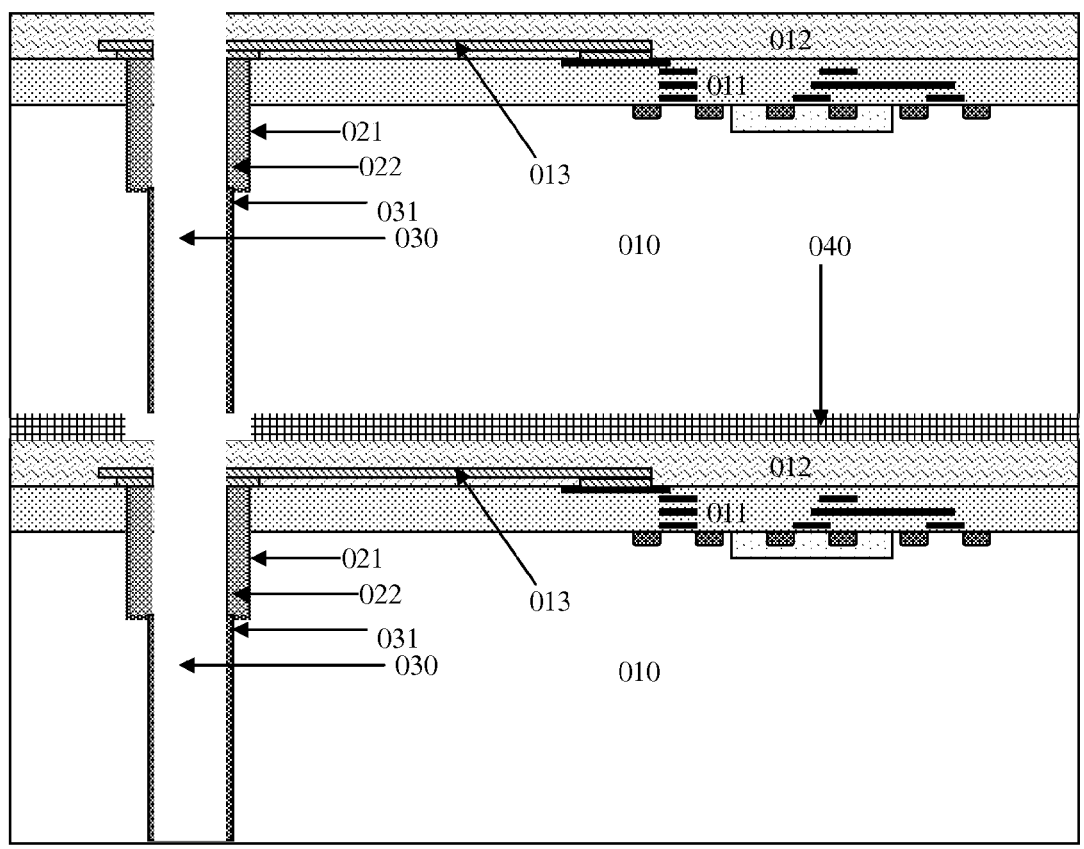
FIG. 5 is a cross-sectional schematic view illustrating that two layers of wafers which have completed an interconnection are aligned and adhered together in a three-dimensional vertical interconnection method according to an embodiment of the present invention.

Step E. aligning multi-layers of said single layer of wafer or chip which have completed steps A, B, C and D and stacking the same, as shown in FIG. 5. The vertically aligned TSVs of layers of wafers or chips form through layers of wafers or chips hole that penetrates the stacked wafers or chips. The vertically adjacent wafers or chips may be adhered by using an adhesive layer 040 of organics such as polyimide, BCB, epoxy resin, etc., or may be welded by using conventional welding solders such as solders of Al—Ge, Au—Sn, Cu—Sn, etc.

This step may include a process of patterning the adhesive material layer 040, so that the wafers are bonded to form micro-fluid channels for heat dissipation.

The adhesive layer 040 in this step may be selected as organics or metallic solders, wherein the organics includes polyimide, epoxy resin, ultraviolet ray adhesive tape, dibenzo cyclobutene, non-conductive adhesive, silicon rubber or p-Xylene, and may be also selected as metallic solders including but not limited to copper, tungsten, gold, silver, tin, indium, nickel, palladium, copper-tin alloy, tin-silver-copper alloy, tin-silver alloy, gold-tin alloy, indium-gold alloy, lead-tin alloy, nickel-palladium alloy, nickel-gold alloy or nickel-palladium-gold alloy. But not limit to this, other conventional solders in the semiconductor processing industry may be also used.

Figure 6:
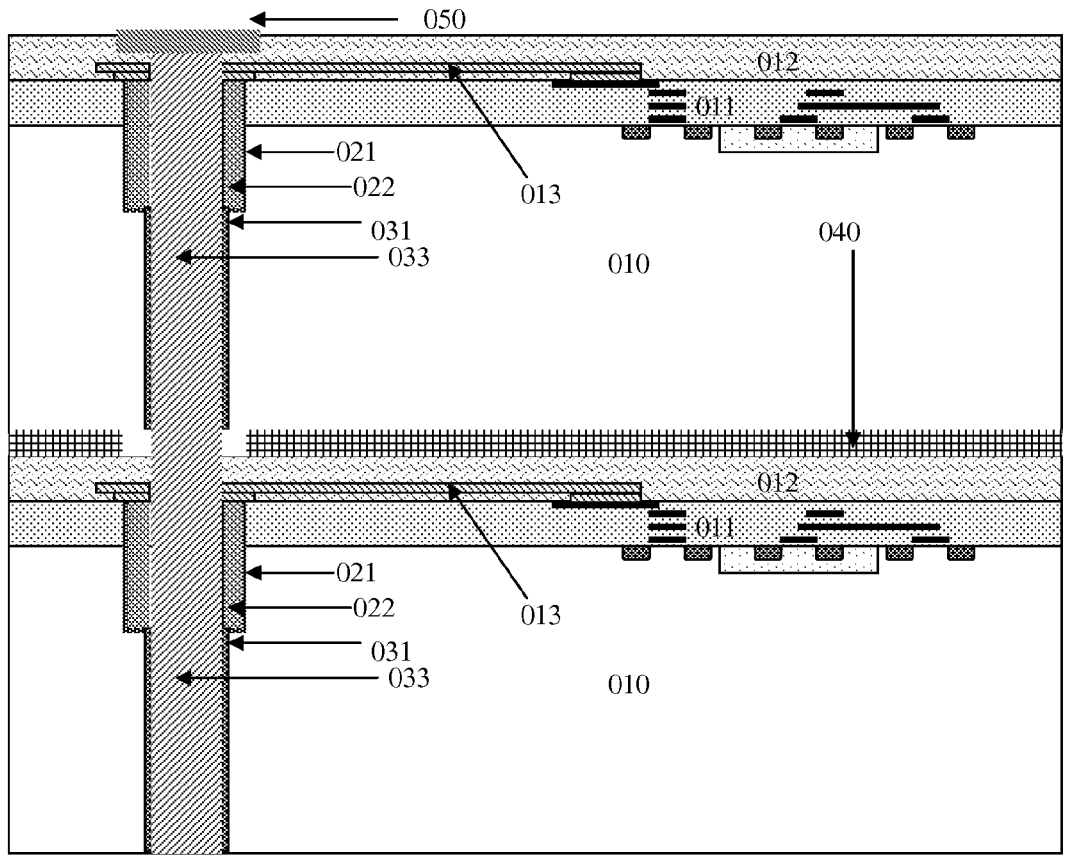
FIG. 6 is a cross-sectional schematic view illustrating that two layers of wafers which have completed an interconnection are aligned, adhered, and electroplated for filling to implement a vertical interconnection in a three-dimensional vertical interconnection method according to an embodiment of the present invention.

Step F. depositing a seed layer on one surface of the multi-stacked layers of wafers or chips, and conducting copper electroplating, to seal the through layers of wafers or chips holes constituted of vertically aligned TSVs 030; filling the through layers of wafers or chips hole from bottom to top with copper electroplating to form a micro electrical conductive pole 033; conducting electroplating with solder balls or bonding pads 050; removing the electroplated seed layer, for finishing the fabrication of a three-dimensional vertically interconnected structure, as shown in FIG. 6.

The through layers of wafers or chips hole 030 of the stacks in this step may be also filled through copper electroplating with an assistance wafer. In particular, a seed layer is deposited on one surface of the assistance wafer and then the stacked wafers or chips is clamped to the assistance wafer. The through layers of wafers or chips hole 030 is filled with copper electroplating from bottom to top to form a micro electrical conductive pole which penetrates the stacked wafers or chips.

The Sixth Embodiment

A method for fabricating a three-dimensional vertically interconnected structure comprises the following steps:

Step A. conducting lithography on the front surface of a single layer of silicon wafer or chip which has completed the fabrication of microelectronic devices therein to form photo-resist masks for annular patterns, and then sequentially etching the dielectric layer 011 and the substrate layer 010 of the single layer of wafer or chip to form a fergitun-shaped concave 020. FIG. 1(*a*) and FIG. 1(*b*) are respectively a top view and a cross-sectional view of the fergitun-shaped concave 020 along the radial direction. Etching of the dielectric layer 011 may be implemented by applying RIE or other wet or dry etching technologies. Etching of the substrate layer 010 may be implemented by applying DRIE or other wet or dry etching technologies. It's proposed that the depth of the concave is in a range from 1 μm to 30 μm. The single layer of wafer or chip may be an ultra-thin one which has been conducted a thinning process on the backside thereof.

Step B. depositing a barrier layer of TiW and a seed layer of gold (Au) or copper (Cu) to cover the sidewall and the bottom of the fergitun-shaped concave 020; conducting lithography to form a photo-resists mask on the front surface of the wafer which exposes the concave region and an electrode contacting area and covers the remaining areas of the wafers; conducting copper electroplating to fill the fergitun-shaped concave 020. The metal filled inside of the fergitun-shaped concave 020 forms a fergitun-shaped electrical conductive ring 022, as shown in FIG. 2. The photo-resist, the barrier layer and the seed layer outside the concave are then removed, and the front surface can be planarized depending on requirements. An insulation layer 021 of a material such as sillica, polyimide, etc. can be deposited to cover the wall of the concave 020, before depositing the barrier layer and the seed layer. The deposition of the barrier layer and the seed layer can be implemented by applying conventional processes in semiconductor industry such as methods of sputtering, evaporation, chemical vapor deposition (CVD), etc. The deposition of materials for the insulation layer can be implemented by applying conventional processes in semiconductor industry such as sputtering, plasma enhanced chemical vapor deposition (PECVD), etc.

Figure 3:
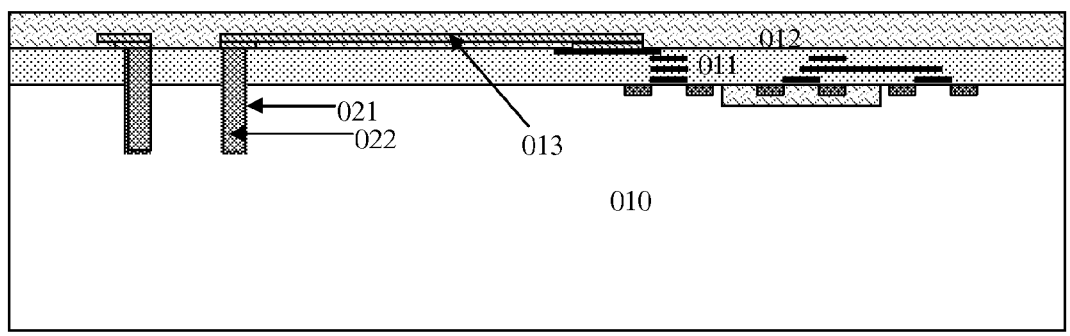
FIG. 3 is a cross-sectional schematic view illustrating a state where a redistribution layer is formed on the font surface of a single layer of wafer or chip in a three-dimensional vertical interconnection method according to an embodiment of the present invention.
Figure 4:
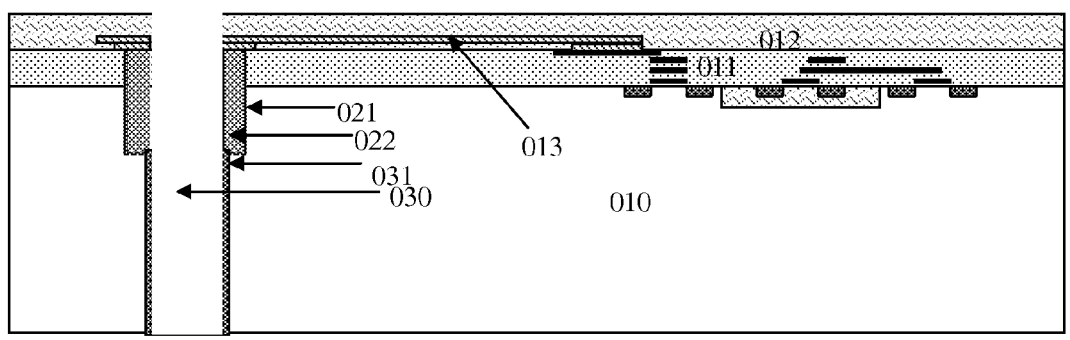
FIG. 4 is a cross-sectional schematic view illustrating that a TSV is formed inside an electrical conductive ring of the front surface of a single layer of wafer or chip and the sidewall is insulated in a fabricating method for a three-dimensional vertically interconnected structure according to in an embodiment of the present invention.

Step C. forming a redistribution layer 012 which connects the electrical conductive ring 022 with microelectronic devices inside the wafer or chip, wherein an interconnecting wire 013 of the redistribution layer 012 can be of metal such as copper, aluminum, etc., and can be also of other conductive materials. A dielectric layer of the redistribution layer 012 may be of a material such as polyimide, BCB, epoxy resin, etc., and may be also of other dielectric materials. This step includes but not limited to formation of at least one redistribution layer 012. As shown in FIG. 3.

Step D. conducting lithography, and sequentially etching the dielectric layer 012 of the redistribution layer and the dielectric layer 011 of the wafer or chip to form a blind TSV 035 inside the electrical conductive ring 022; The blind TSV has the same radius and the center as the inner ring of the electrical conductive ring 022. The forming of the blind TSV 035 may be implemented by applying drilling technologies such as DRIE etching, laser drilling, etc. Under condition of etching technology, etching of the dielectric layer 011 and the dielectric layer of the redistribution layer 012 may be implemented by applying RIE or other wet or dry etching technologies. Etching of the substrate layer 010 of the wafer or chip may be implemented by applying DRIE etching technology. A material for an insulation layer such as sillica may be deposited to cover the sidewall and the bottom of the blind TSV 035 for insulation thereof. Conducting etching at an opening of the blind TSV 035 to remove the insulation layer inside the electrical conductive ring and expose the sidewall of the electrical conductive ring 022.

Figure 7:
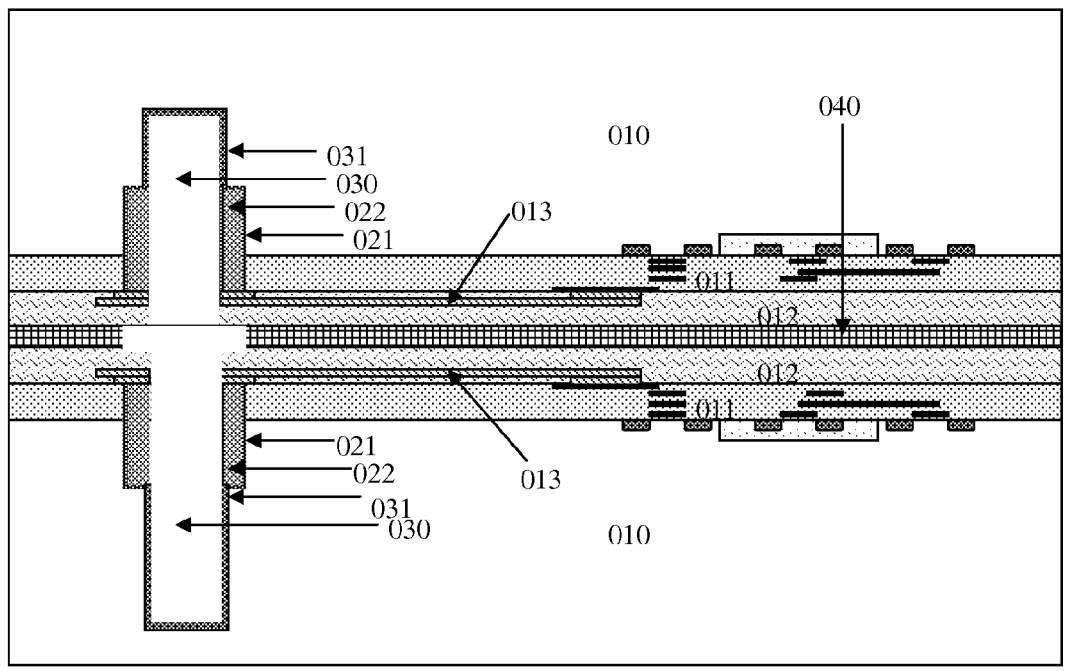
FIG. 7 is a cross-sectional schematic view illustrating that two layers of wafers which have completed an interconnection are aligned front to front and adhered in a three-dimensional vertical interconnection method according to an embodiment of the present invention.

Step E. as shown in FIG. 7, aligning two layers of the single layer of wafer or chip which have completed steps A-D face-to-face, and the wafers or chips are adhered to each other by an adhesive material. The adhesive material 040 in this step may be selected as organics or metallic solders, wherein the organics includes polyimide, epoxy resin, ultraviolet ray adhesive tape, ibenzo cyclobutene, non-conductive adhesive, silicon rubber or p-Xylene, and may be also selected as metallic solders including but not limited to copper, tungsten, gold, silver, tin, indium, nickel, palladium, copper-tin alloy, tin-silver-copper alloy, tin-silver alloy, gold-tin alloy, indium-gold alloy, lead-tin alloy, nickel-palladium alloy, nickel-gold alloy or nickel-palladium-gold alloy. But not limited to this, other conventional solders in semiconductor processing industry may be also used.

This step may include a process of patterning the adhesive material 040, to form micro-fluid channels for heat dissipation.

Figure 8:
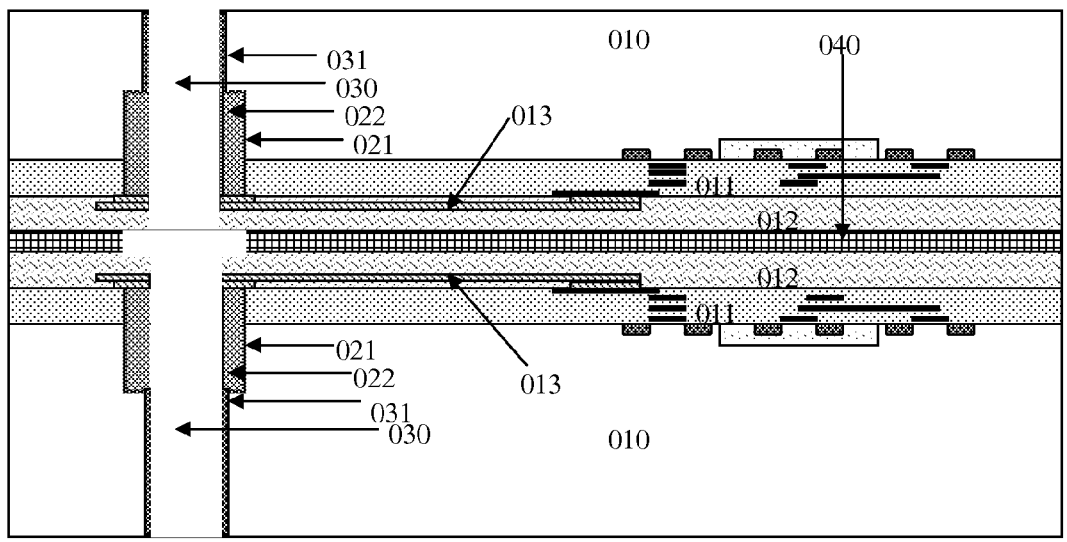
FIG. 8 is a cross-sectional schematic view illustrating that two layers of wafers which have completed an interconnection are aligned front to front, adhered and thinned on both sides of the wafer to implement a through layers of wafer or chip hole with TSVs on each layers of wafer or chip being vertically aligned in a three-dimensional vertical interconnection method according to an embodiment of the present invention.

Step F. conducting a thinning process on two sides of the two layers of wafers or chips which have completed a stacking, until exposing the blind TSVs 030 on both surfaces of the stacked wafers to implement a through layers of wafers or chips hole, as shown in FIG. 8. The thinning process may be implemented by applying chemically mechanical polishing (CMP) or other wet or dry thinning technologies.

Figure 9:
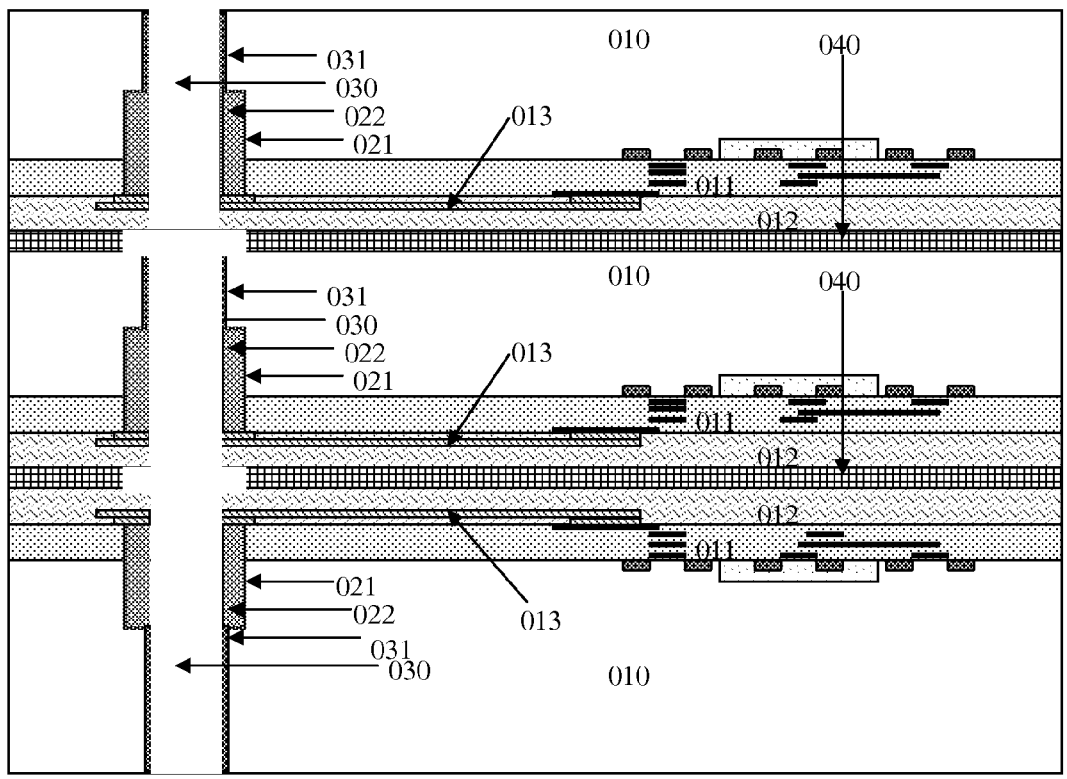
FIG. 9 is a cross-sectional schematic view illustrating that another layer of wafers is stacked above a pair of wafers which have completed an interconnection and are adhered face to face, and that the another layer of wafers is conducted a thinning process on the backside thereof in a three-dimensional vertical interconnection method according to an embodiment of the present invention.

Step G. stacking another single layer of wafer which has completed steps A-D with those layers of wafers or chips having completed steps A-F, and then repeating steps E and F to implementing a stacking of three or more layers of wafers or chips. As shown in FIG. 9.

Figure 10:
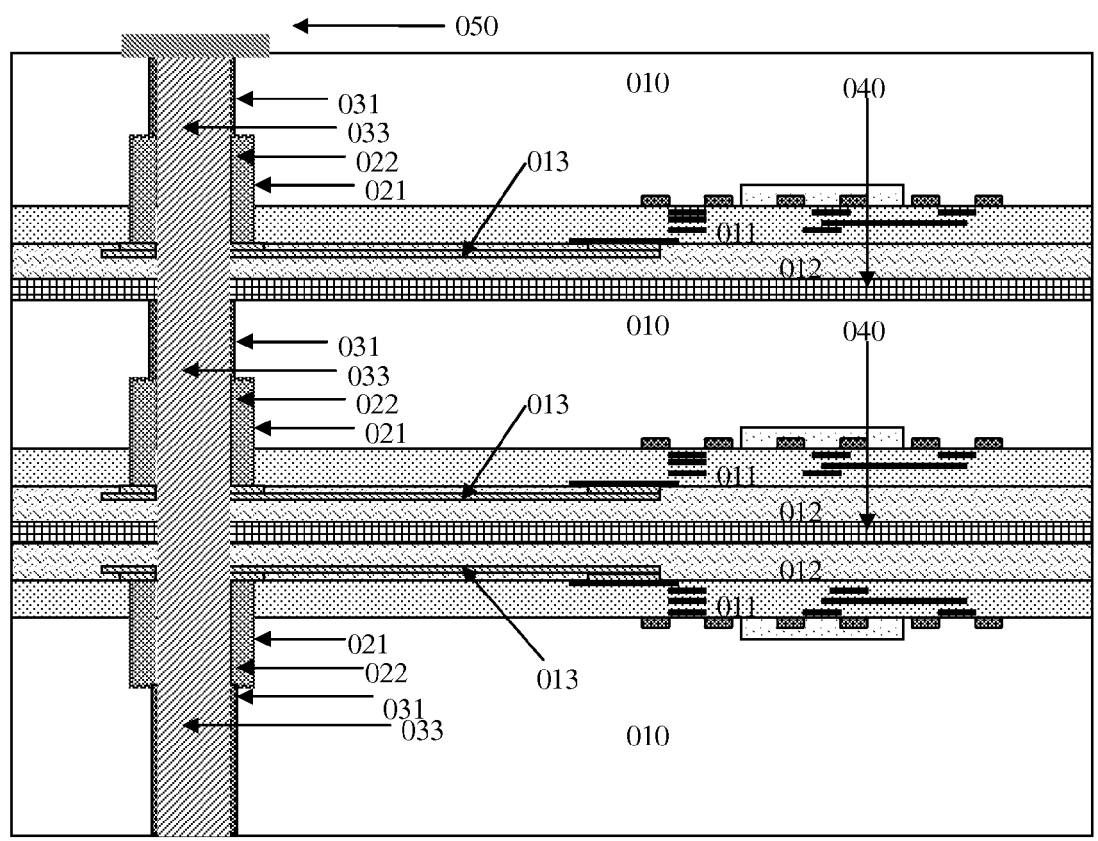
FIG. 10 is a cross-sectional schematic view illustrating that two layers of wafers which have completed an interconnection are aligned, adhered, and the through layers of wafers or chips hole is filled with electroplating to implement a vertical interconnection in a three-dimensional vertical interconnection method according to an embodiment of the present invention.

Step H. depositing a seed layer and conducting electroplating on one side of multi-stacked wafers or chips to seal the through layers of wafers or chips holes constituted of vertically aligned TSVs; filling the through layers of wafers or chips hole from bottom to top with copper electroplating to form a micro electrical conductive pole; conducting tin electroplating to form solder balls or bonding pads 050; removing the seed layer, for finishing the fabrication of a three-dimensional vertically interconnected structure, as shown in FIG. 10.

The through layers of wafers or chips hole 030 of the stacks in this step may be also filled through copper electroplating with an assistance wafer. In particular, a seed layer is deposited on one surface of the assistance wafer and then the stacked wafers or chips is clamped to the assistance wafer. The through layers of wafers or chips hole 030 is filled with copper electroplating from bottom to top to form a micro electrical conductive pole which penetrates the stacked wafers or chips It can be seen from the above-mentioned examples that, compared with traditional TSV based three-dimensional integration technologies, the present invention has implemented an adhesion between adjacent layers of wafers or chips and an electric interconnection between wafers or chips through different structures. Organic materials and solders are applied to implement the adhesion between but not the electric interconnection between different layers of wafers or chips, therefore flexible bonding, welding and adhesive technologies for wafers may be used. The electrical conductive ring that surrounds a micro electrical conductive pole internally penetrating the stacked wafers or chips implements an electric interconnection between wafers and an electric interconnection between microelectronic devices inside the wafers or chips, with simple process and high reliability. The designs for micro-fluid channels and thermal conductive layers between vertically adjacent wafers or chips in stacks can effectively relieve heat accumulation of chips in stacks. The designs of micro-fluid channels and thermal conductive layers between vertically adjacent wafers or chips in the stacks can effectively relieve a heat accumulation of chips in the stacks. The design of grounding metallic layers between vertically adjacent wafers or chips in the stacks can effectively relieve a signal crosstalk between chips in the stacks. After finishing an adhesion between multi-layered wafers and chips, a micro electrical conductive pole which internally penetrates the TSV of the stacks is formed in a single process, which implements an electric interconnection between different layers of wafers or chips of a three-dimensional vertically interconnected structure. Therefore, the difficulty in the filling process is reduced, the processing time is shortened and the rate of finished, electroplated products is increased.

The descriptions above are only preferred embodiments of the present invention. It should be pointed out that, for those skilled in the art, several modifications and variations may further be made without departing from technical principle, which should also be regarded as falling into the scope of protection of the present invention.

INDUSTRIAL APPLICABILITY

The technical solution of the present invention has the following advantages: it implements an adhesion between adjacent layers of wafers or chips and an electric interconnection between wafers or chips via different structures. Organic materials and solders are applied to implement the adhesion but not the electric interconnection between different layers of wafers or chips, therefore flexible bonding, welding and adhesive bonding technologies for wafers may be used. A conductive ring that surrounds a micro electrical conductive pole internally penetrating the stacked wafers or chips implements an electric interconnection between different layers of wafers through the micro electrical conductive pole and an electric interconnection between microelectronic devices inside the wafers or chips, with simple process and high reliability. The designs of micro-fluid channels and thermal conductive layers between vertically adjacent wafers or chips in the stacks can effectively relieve a heat accumulation of chips in the stacks. The design of grounding metallic layers between vertically adjacent wafers or chips in the stacks can effectively relieve a signal crosstalk between chips in the stacks. After finishing an adhesion between multi-layered wafers and chips, a micro electrical conductive pole which internally penetrates TSV through holes of the stacks is formed in a single process, which implements an electric interconnection between different layers of wafers or chips of a three-dimensional vertically interconnected structure. Therefore, the difficulty in the filling process is reduced, the processing time is shortened and the rate of finished, electroplated products is increased.

What is claimed is:

1. A three-dimensional vertically interconnected structure, characterized in that, it comprises at least two layers of chip which are stacked in sequence or stacked together face to face, and a layer of adhesive material is used for adhesion between adjacent layers of said chip, each layer of said chip containing a substrate layer and a dielectric layer sequentially from bottom to top; a front surface of the chip has a first concave with an annular cross section, and the first concave is filled with metal therein to form a first electrical conductive ring which is connected to microelectronic devices inside the chip via a redistribution layer; a first through layers of wafers or chips hole having the same radius and the center as the inner ring of the first conductive ring penetrates the stacked chips and has a first micro electrical conductive pole therein; wherein a front surface and/or a backside surface of each layer of said wafer or chip have/has a thermal conductive ring, the front surface and/or backside surface of the wafer or chip have/has a thermal conductive layer, and the thermal conductive layer is connected with the thermal conductive ring; a second through layers of chips hole having the same radius and center as the inner ring of the thermal conductive ring penetrates the chips which are stacked and has a micro thermal conductive pole therein.

2. The three-dimensional vertically interconnected structure of claim 1, characterized in that, the front surface and/or the backside surface of each layer of said chip have/has a second concave with an annular cross section, and the second concave is filled with metals therein to form a second conductive ring; the front surface and/or the backside surface of the chip are/is coated with a grounding conductive layer, and the second conductive ring is connected with a grounding electrical conductive layer; a third through layers of wafers or chips hole having the same radius and center as the inner ring of the second conductive ring penetrates the chips which are stacked and has a second micro electrical conductive pole therein.

3. The three-dimensional vertically interconnected structure of claim 2, characterized in that, the grounding electrical conductive layer is of a metallic material including gold, copper or aluminum, or the grounding electrical conductive layer is of conductive paste.

4. The three-dimensional vertically interconnected structure of claim 2, characterized in that, the first through layers of wafers or chips hole, the second through layers of wafers or chips hole and/or the third through layers of wafers or chips hole have/has a shape of cylinder, prism, cone or pyramid.

5. The three-dimensional vertically interconnected structure of any one of claim 1 or 2, characterized in that, the adhesive material between adjacent layers of the chip has micro-fluid channel therein, and the micro-fluid channel contains a fourth through layers of wafers or chips hole vertically penetrating the chips which are stacked.

6. The three-dimensional vertically interconnected structure of claim 1, characterized in that, the adhesive material is organics or metallic solders; the organic adhesive material includes polyimide, epoxy resin, ultraviolet rays adhesive tape, dibenzo cyclobutene, non-conductive adhesive, silicon rubber or p-Xylene, and the metallic solder includes copper, tungsten, gold, silver, tin, indium, nickel, palladium, copper-tin alloy, tin-silver-copper alloy, tin-silver alloy, gold-tin alloy, indium-gold alloy, lead-tin alloy, nickel-palladium alloy, nickel-gold alloy or nickel-palladium-gold alloy.

7. The three-dimensional vertically interconnected structure of claim 1, characterized in that, a depth of the first concave is in a range from 1 μm to 30 μm.

8. The three-dimensional vertically interconnected structure of claim 1, characterized in that, the thermal conductive layer is of a metallic thermal conductive material including gold, copper or aluminum.

* * * * *